US012563865B2

(12) United States Patent
Ye

(10) Patent No.: US 12,563,865 B2
(45) Date of Patent: Feb. 24, 2026

(54) EPITAXIAL STRUCTURE AND LIGHT-EMITTING DIODE INCLUDING THE SAME

(71) Applicant: XIAMEN SAN'AN OPTOELECTRONICS CO., LTD., Xiamen (CN)

(72) Inventor: Daqian Ye, Tianjin (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 682 days.

(21) Appl. No.: 17/813,446

(22) Filed: Jul. 19, 2022

(65) Prior Publication Data

US 2023/0024236 A1 Jan. 26, 2023

(30) Foreign Application Priority Data

Jul. 22, 2021 (CN) .......................... 202110831413.4

(51) Int. Cl.
H10H 20/816 (2025.01)
H10H 20/812 (2025.01)
H10H 20/825 (2025.01)

(52) U.S. Cl.
CPC ........ H10H 20/816 (2025.01); H10H 20/812 (2025.01); H10H 20/8252 (2025.01)

(58) Field of Classification Search
CPC ........ H01L 33/14; H01L 33/06; H01L 33/325
See application file for complete search history.

(56) References Cited

U.S. PATENT DOCUMENTS

| | | | | |
|---|---|---|---|---|
| 2008/0251781 A1* | 10/2008 | Han | ..................... | H10H 20/824 257/13 |
| 2011/0121261 A1* | 5/2011 | Lee | ...................... | A23B 11/162 257/E33.028 |
| 2013/0168639 A1* | 7/2013 | Lee | ...................... | H10H 20/812 257/13 |
| 2014/0131658 A1* | 5/2014 | Chen | .................... | H10H 20/824 257/13 |

\* cited by examiner

*Primary Examiner* — William B Partridge
*Assistant Examiner* — Chevy J Boegel
(74) *Attorney, Agent, or Firm* — Thomas Horstemeyer, LLP

(57) ABSTRACT

An epitaxial structure includes an n-type layer, a p-type layer, an active layer, and a current spreading layer. The active and current spreading layers respectively have first and third concentration profiles of indium which respectively include first and third characteristic peaks. A heavily doped layer formed between the active and current spreading layers has a second concentration profile of silicon with a second characteristic peak. A ratio of a first minimum horizontal distance between peak tops of first and third characteristic peaks, to a second minimum horizontal distance between peak tops of second and third characteristic peaks, is less than one seventh.

16 Claims, 3 Drawing Sheets

EPITAXIAL STRUCTURE AND LIGHT-EMITTING DIODE INCLUDING THE SAME

CROSS-REFERENCE TO RELATED APPLICATION

This application claims priority of Chinese Invention Patent application No. 202110831413.4, filed on Jul. 22, 2021.

FIELD

The disclosure relates to an epitaxial structure and a light-emitting diode including the same.

BACKGROUND

Group III nitrides, such as gallium nitride (GaN), are direct wide-bandgap semiconductor materials, which have high thermal conductivity, high hardness, low dielectric constant, high temperature resistance, acid and alkali resistance, and are widely used in various types of light-emitting diodes such as blue light-emitting diodes, green light-emitting diodes, and ultraviolet light-emitting diodes. In a GaN-based light-emitting diode, the epitaxial structure includes an n-type GaN layer, an active layer, and a p-type GaN layer, in which the active layer has a stacked structure formed by alternately stacking GaN layers and InGaN (indium gallium nitride) layers one on another. Since GaN and InGaN differ in lattice constant, polarization may be induced at an interface between the GaN layers and the InGaN layers, which causes dislocations at the interface and results in a large number of surface defects. Besides, since the InGaN layers must be grown under low temperature due to its high In concentration, surface defects will also be formed during such low temperature growth process. Such surface defects may form current leakage channels, which cause reduction of the efficiency of the light-emitting diode and the anti-static capability of an epitaxial structure of the light-emitting diode.

SUMMARY

Therefore, an object of the disclosure is to provide an epitaxial structure which can alleviate at least one of the drawbacks of the prior art.

According to a first aspect of the disclosure, an epitaxial structure includes an n-type layer, a p-type layer, an active layer, a heavily doped layer, and a current spreading layer. The active layer is disposed between the n-type layer and the p-type layer, and has a first concentration profile of indium. The first concentration profile of indium includes a plurality of first characteristic peaks each of that has a peak top. The heavily doped layer is disposed between the n-type layer and the active layer, and has a second concentration profile of silicon. The second concentration profile of silicon includes a second characteristic peak that has a peak top. The current spreading layer is disposed between the heavily doped layer and the active layer, and has a third concentration profile of indium. The third concentration profile of indium includes a plurality of third characteristic peaks each of that has a peak top. A ratio of a first minimum horizontal distance, that is measured between the peak tops of the first characteristic peaks and the peak tops of the third characteristic peaks, to a second minimum horizontal distance, that is measured between the peak top of the second characteristic peak and the peak tops of the third characteristic peaks, is less than one seventh.

According to a second aspect of the disclosure, a light-emitting diode includes the aforesaid epitaxial structure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
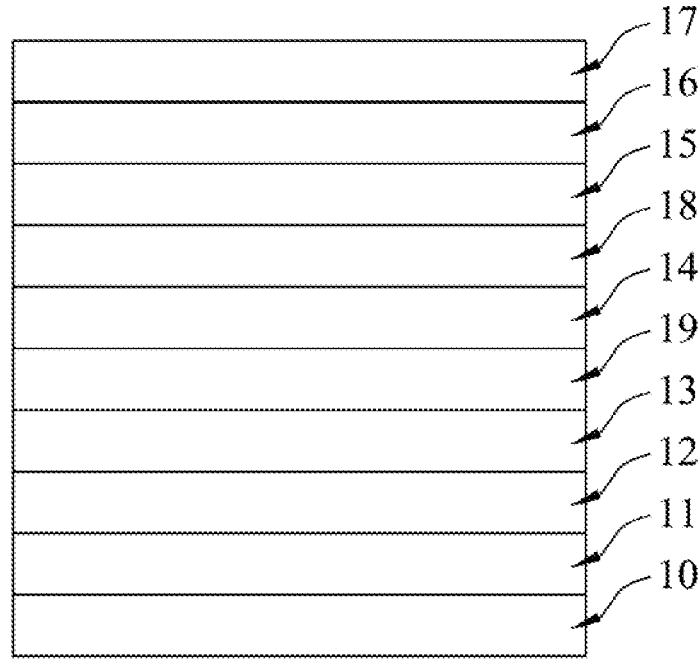
FIG. 1 is a schematic view illustrating an epitaxial structure of an embodiment according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an epitaxial structure according to an embodiment of the present disclosure includes a substrate 10, a buffer layer 11, an n-type layer 12, a heavily doped layer 13, a second intermediate layer 19, a current spreading layer 14, a first intermediate layer 18, an active layer 15, an electron barrier layer 16, and a p-type layer 17.

Figure 2:
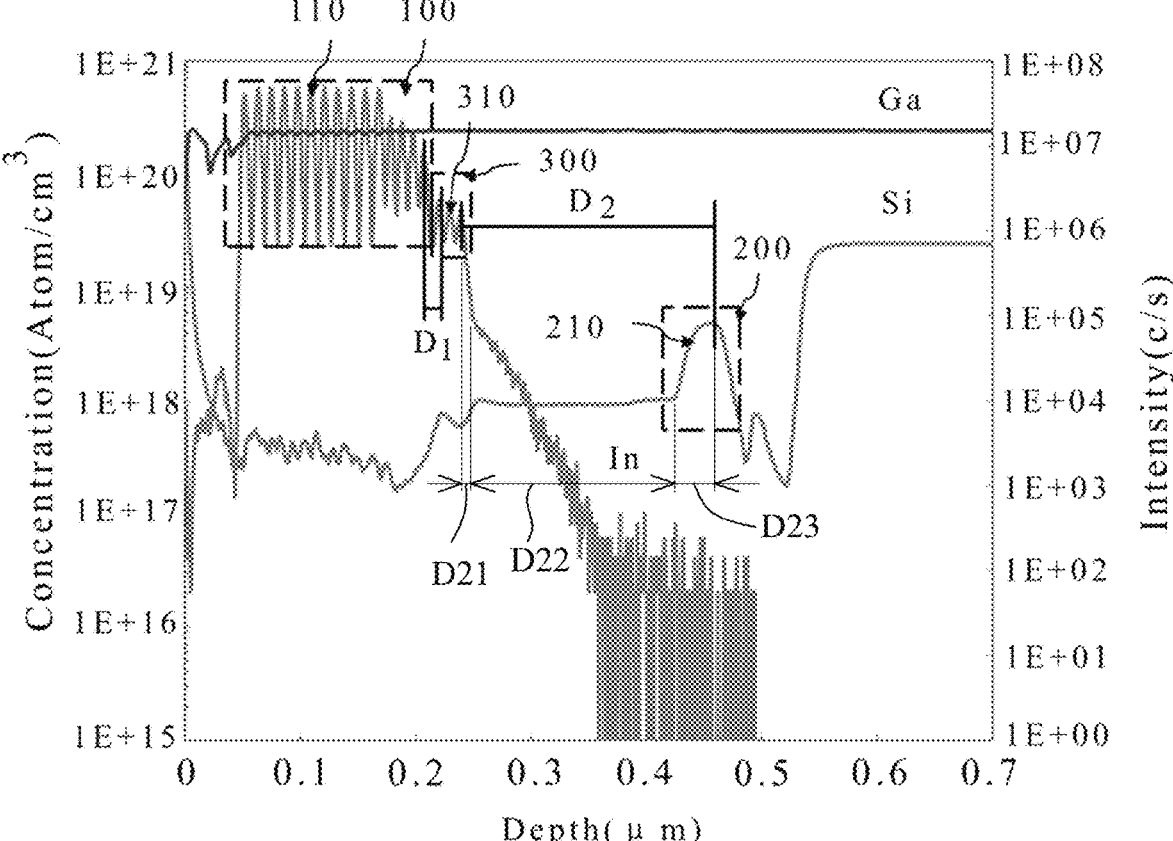
FIG. 2 shows depth concentration profiles of the embodiment.
Figure 3:
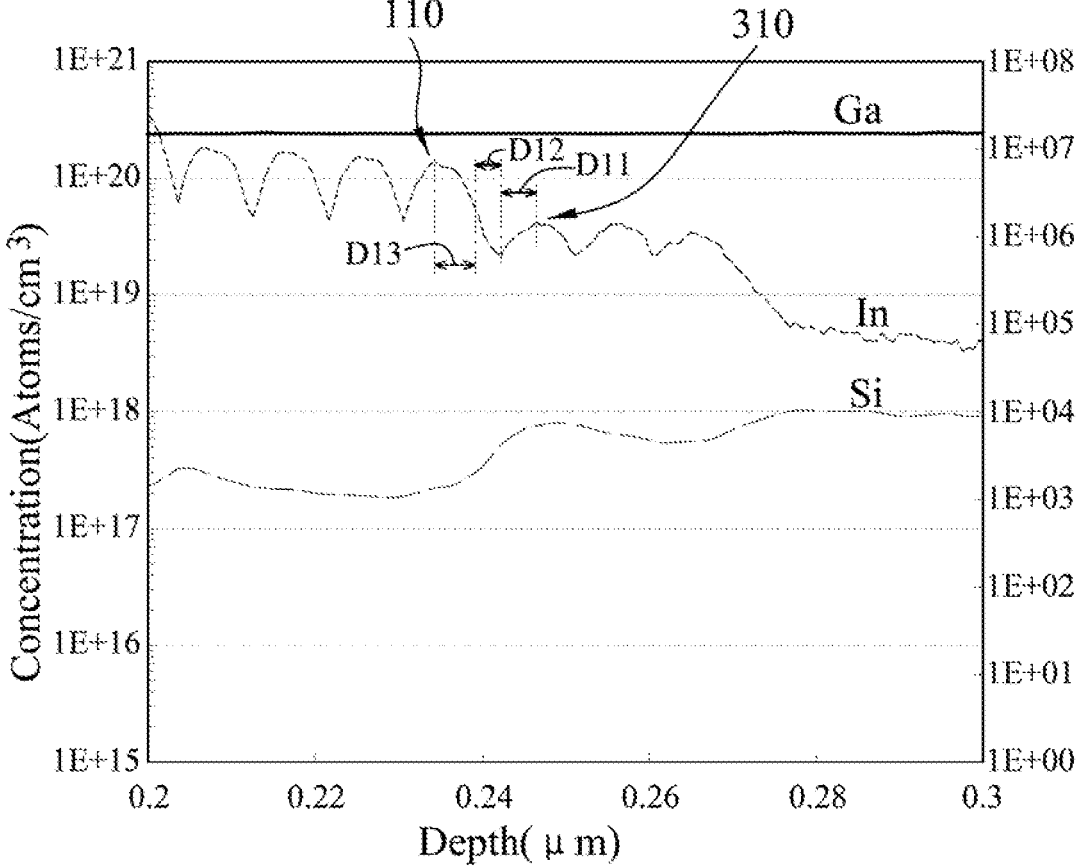
FIG. 3 shows enlarged portions of the depth concentration profiles shown in FIG. 2.

It should be noted that the composition of each layer of the epitaxial structure can be analyzed by any suitable means, such as a secondary ion mass spectrometer (SIMS), and the thickness of each layer of the epitaxial structure can be analyzed by any suitable means, such as a transmission electron microscopy (TEM) or a scanning electron microscopy (SEM). In this embodiment, different depths of the epitaxial structure from the active layer 15 to the heavily doped layer 13 and element concentrations and ionic intensities at the different depths of the epitaxial structure are analyzed by TEM or SEM in combination with SIMS. The results of an analysis of the epitaxial structure are shown in FIGS. 2 and 3.

The substrate 10 may be made of one of sapphire, gallium nitride (GaN), silicon, and silicon carbide, but is not limited in this respect. In this embodiment, the substrate 100 is made of sapphire.

The buffer layer 11 is formed on the substrate 10. In some embodiments, the buffer layer 11 includes an undoped GaN and has a thickness ranging from 0.5 μm to 1.5 μm.

The n-type layer 12 is formed on the buffer layer 11 opposite to the substrate 10. In some embodiments, the n-type layer 12 includes a silicon-doped GaN that has a silicon doping concentration ranging between $1 \times 10^{19}$ cm$^{-3}$ and $3 \times 10^{19}$ cm$^{-3}$.

The active layer 15 is disposed between the n-type layer 12 and the p-type layer 17, and has a first concentration profile 100 of indium. The first concentration profile 100 of indium includes a plurality of first characteristic peaks 110 each of that has a peak top (see FIG. 2). In some embodiments, the active layer 15 includes a periodic superlattice structure that is formed from multiple quantum well (MQW) layers. In some embodiments, the periodic superlattice structure of the active layer 15 is formed from $In_y Ga_{1-y}N$ potential well layers, and GaN potential barrier layers which alternate with the $In_yGa_{1-y}N$ potential well layers, and wherein $0 \leq y \leq 0.8$. The number of periodic cycles of the periodic superlattice structure of the active layer 15 may range from 6 to 20. In some embodiments, in each of the periodic cycles of the periodic superlattice structure of the active layer 15, the GaN potential barrier layer is grown previous to the growth of the $In_yGa_{1-y}N$ potential well layer. In each of the periodic cycles of the periodic superlattice structure of the active layer 15, the GaN potential barrier layer has a thickness ranging from 4 nm to 12 nm, and the $In_yGa_{1-y}N$ potential well layer has a thickness ranging from 2 nm to 4 nm.

The heavily doped layer 13 is disposed between the n-type layer 12 and the active layer 15 so as to supply electrons to counteract an external electric field when the epitaxial structure or the light-emitting diode including the same is subjected to an electrostatic shock. The heavily doped layer 13 has a second concentration profile 200 of silicon. The second concentration profile 200 of silicon includes a second characteristic peak 210 that has a peak top. In some embodiments, the heavily doped layer 13 includes a silicon-doped GaN that has a silicon doping concentration ranging between $1 \times 10^{18}$ $cm^{-3}$ and $6 \times 10^{18}$ $cm^{-3}$.

The current spreading layer 14 is disposed between the heavily doped layer 13 and the active layer 15, and has a third concentration profile 300 of indium. The third concentration profile 300 of indium includes a plurality of third characteristic peaks 310 each of that has a peak top. In some embodiments, the current spreading layer 14 includes a periodic superlattice structure. The periodic superlattice structure of the current spreading layer 14 is formed from Ga layers, and $In_xGa_{1-x}N$ layers which alternate with the GaN layers, and wherein $0 \leq x \leq 0.4$. The number of periodic cycles of the periodic superlattice structure of the current spreading layer 14 may range from 3 to 30. In some embodiments, in each of the periodic cycles of the periodic superlattice structure of the current spreading layer 14, the GaN layer is grown previous to the growth of the $In_xGa_{1-x}N$ layer. In each of the periodic cycles of the periodic superlattice structure of the current spreading layer 14, the GaN layer has a thickness ranging from 8 nm to 10 nm, and the $In_xGa_{1-x}N$ layer has a thickness ranging from 1 nm to 2 nm. The current spreading layer 14 may have a thickness greater than 30 nm and less than 80 nm. In some embodiments, each of the periodic cycles of the periodic superlattice structure of the active layer 15 has an indium doping concentration that is greater than that of each periodic cycle of the periodic superlattice structure of the current spreading layer 14. That is, the value of y in the $In_yGa_{1-y}N$ potential well layer of the active layer 15 is greater than the value of x in the $In_xGa_{1-x}N$ layer of the current spreading layer 14.

A ratio of a first minimum horizontal distance ($D_1$), that is measured between the peak tops of the first characteristic peaks 110 and the peak tops of the third characteristic peaks 310 along a horizontal axis marked with depth values (see FIG. 2), to a second minimum horizontal distance ($D_2$), that is measured between the peak top of the second characteristic peak 210 and the peak tops of the third characteristic peaks 310 along the horizontal axis, is less than one seventh. That is, ($D_1$)/($D_2$) is less than one seventh. In FIG. 2, the ratio of the first minimum horizontal distance ($D_1$) to the second minimum horizontal distance ($D_2$) is depicted as one tenth.

The first minimum horizontal distance ($D_1$) may be adjusted to reduce a distance between the current spreading layer 14 and the active layer 15 so that, when the epitaxial structure or the light-emitting diode including the is subjected to an same electrostatic shock, the shock current may be guided by the current spreading layer 14 so as not to flow into the active layer 15, thereby enhancing the anti-static capability of the epitaxial structure and the light-emitting diode including the same.

The first minimum horizontal distance ($D_1$) may be less than 20 nm, or may be less than 15 nm.

For further explaining the first minimum horizontal distance ($D_1$), in the following description, the first concentration profile 100 of indium is exemplified to include N number of first characteristic peaks 110, and the third concentration profile 300 of indium is exemplified to include three third characteristic peaks 310.

Referring to FIG. 2, the first concentration profile 100 of indium includes N number of first characteristic peaks 110 which are respectively defined as first characteristic peak (I), first characteristic peak (II), . . . , and first characteristic peak (N) in such order along a depth increasing direction of the horizontal axis. The third concentration profile 300 of indium includes three third characteristic peaks 310 which are respectively defined as third characteristic peak (I), third characteristic peak (II), and third characteristic peak (III) in such order along the depth increasing direction of the horizontal axis. The peak top of the third characteristic peak (I) and the peak top of the first characteristic peak (N) are the closest ones of the peak tops between the third concentration profile of indium 300 and the first concentration profile 100 of indium, and the distance therebetween is the first minimum horizontal distance ($D_1$) in this embodiment, which may be less than 20 nm.

In some embodiments, the second minimum horizontal distance ($D_2$) is greater than 150 nm, such as greater than 200 nm.

For further explaining the second minimum horizontal distance ($D_2$), in the following description, the third concentration profile 300 of indium is exemplified to include e three third characteristic peaks 310.

Referring to FIG. 2, the third concentration profile 300 of indium includes three third characteristic peaks 310 which are respectively defined as third characteristic peak (I), third characteristic peak (II), and third characteristic peak (III) in such order along the depth increasing direction of the horizontal axis, while the second concentration profile 200 of silicon includes a second characteristic peak 210. The peak top of the third characteristic peak (III) and the peak top of the second characteristic peak 210 are the closest ones of the peak tops between the third concentration profile 300 of indium and the second concentration profile 200 of silicon, and a distance therebetween is the second minimum horizontal distance ($D_2$) in this embodiment, which may be greater than 150 nm.

The first intermediate layer 18 is disposed between the current spreading layer 14 and the active layer 15. When the current spreading layer 14, the heavily doped layer 13, or the n-type layer 12 has a growth defect, the first intermediate layer 18 can prevent the active layer 15 from being affected by the growth defect, thereby ensuring that the growth of the active layer 15 is substantially flat and the active layer 15 has good growth quality. The first intermediate layer 18 has a thickness less than the first minimum horizontal distance ($D_1$).

In detail, as shown in FIG. 3, the first minimum horizontal distance ($D_1$) is a sum of a first distance ($D_{11}$), a second distance ($D_{12}$), and a third distance ($D_{13}$). The first distance ($D_{11}$) is a horizontal distance between a peak top and a peak bottom of one of the third characteristic peaks 310 that is adjacent to the first characteristic peak 110, wherein the peak bottom m is located between the adjacent third characteristic peak 310 and first characteristic peak 110. The second distance ($D_{12}$) is the thickness of the first intermediate layer 18. The third distance ($D_{13}$) is a horizontal distance between a peak top and a peak bottom of one of the first characteristic peaks 110 that is adjacent to the third characteristic peak 310, wherein the peak bottom is located between the adjacent first and third characteristic peaks 110, 310. In some embodiments, the second distance ($D_{12}$) (i.e., the thickness of the first intermediate layer 18) is less than the first minimum horizontal distance ($D_1$), and is not less than 80% of the first minimum horizontal distance ($D_1$).

In some embodiments, the first intermediate layer 18 includes a silicon-doped GaN that has a silicon doping concentration ranging between $1.5\times10^{17}$ cm$^{-3}$ and $5\times10^{17}$ cm$^{-3}$.

The second intermediate layer 19 is disposed between the current spreading layer 14 and the heavily doped layer 13. In some embodiments, the second intermediate layer 19 has a thickness less than the second minimum horizontal distance ($D_2$).

In detail, when the epitaxial structure includes the second intermediate layer 19, the second minimum horizontal distance ($D_2$) is a sum of a first distance ($D_{21}$), a second distance ($D_{22}$), and a third distance ($D_{23}$). The first distance ($D_{21}$) is a horizontal distance between a peak top and a peak bottom of one of the third characteristic peaks 310 that is nearest to the second characteristic peak 210, wherein the peak bottom is located between the peak top and the second characteristic peak 210. The second distance ($D_{22}$) is the thickness of the second intermediate layer 19. The third distance ($D_{23}$) is a horizontal distance between a peak top and a peak bottom of the second characteristic peak 210, wherein the peak bottom is located between the second characteristic peak 210 and the nearest third characteristic peak 310. In some embodiments, the second distance ($D_{22}$) (i.e., the thickness of the second intermediate layer 19) is less than the second minimum horizontal distance ($D_2$), and is not less than 80% of the second minimum horizontal distance ($D_2$).

In some embodiments, the second intermediate layer 19 includes a silicon-doped GaN that has a silicon doping concentration ranging between $1\times10^{18}$ cm$^{-3}$ and $2\times10^{18}$ cm$^{-3}$. Since the second intermediate layer 19 has a relatively large thickness, when the epitaxial structure or the light-emitting diode including the same is subjected to an electrostatic shock, the second intermediate layer 19 can supply a large quantity of electrons to counteract an external electric field so as to prevent static electricity from passing through the epitaxial structure or the light-emitting diode including the same, thereby enhancing the anti-static capability of the epitaxial structure and the light-emitting diode including the same.

The electron barrier layer 16 is disposed between the active layer 15 and the p-type layer 17. In some embodiments, the electron barrier layer 16 includes a magnesium-doped GaN that has a magnesium doping concentration ranging between $1\times10^{18}$ cm$^{-3}$ and $3\times10^{18}$ cm$^{-3}$.

The p-type layer 17 is formed on the electron barrier layer 16 opposite to the active layer 15. In some embodiments, the p-type layer 17 includes a magnesium-doped GaN that has a magnesium doping concentration ranging between $2\times10^{18}$ cm$^{-3}$ and $8\times10^{18}$ cm$^{-3}$.

In a variation of the embodiment, the epitaxial structure further include a second current spreading layer (not shown) that is disposed between the n-type layer 12 and the heavily doped layer 13. The second current spreading layer may include a silicon-doped GaN that has a silicon doping concentration ranging between $1\times10^{17}$ cm$^{-3}$ and $5\times10^{17}$ cm$^{-3}$.

According to this disclosure, an example of a method for manufacturing the abovementioned epitaxial structure includes following steps.

In step S1, the buffer layer 11 is grown on the substrate 10 with a growth temperature ranging from 500° C. to 600° C.

In step S2, the n-type layer 12 is grown on the buffer layer 11 with a growth temperature ranging from 1050° C. to 1150° C.

In step S3, the second current spreading layer and the heavily doped layer 13 are grown on the n-type layer 12 in such order with growth temperatures ranging from 1050° C. to 1150° C. and from 800° C. to 900° C., respectively.

In step S4, the second intermediate layer 19 is grown on the heavily doped layer 13 with a growth temperature ranging from 800° C. to 900° C.

In step S5, the current spreading layer 14 is grown on the second intermediate layer 19 with a growth temperature ranging from 800° C. to 900° C.

In step S6, the first intermediate layer 18 is grown on the current spreading layer 14 with a growth temperature ranging from 800° C. to 900° C.

In step S7, the active layer 15 is grown on the first intermediate layer 18 with a growth temperature ranging from 700° C. to 800° C.

In step S8, the electron barrier layer 16 is grown on the active layer 15 with a growth temperature ranging from 900° C. to 1000° C.

In step S9, the p-type layer 17 is grown on the electron barrier layer 16 with a growth temperature ranging from 800° C. to 900° C.

In step S10, the structure obtained after step S9 is subjected to an annealing process in an inert atmosphere for from 3 to 7 minutes, thereby obtaining the epitaxial structure.

The present disclosure also provides a light-emitting diode that include the epitaxial structure of the embodiment of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An epitaxial structure, comprising:
an n-type layer;
a p-type layer;
an active layer that is disposed between said n-type layer and said p-type layer, and that has a first concentration profile of indium, said first concentration profile of indium including a plurality of first characteristic peaks each of that has a peak top;
a heavily doped layer that is disposed between said n-type layer and said active layer, and that has a second concentration profile of silicon, said second concentration profile of silicon including a second characteristic peak that has a peak top; and
a current spreading layer that is disposed between said heavily doped layer and said active layer, and that has a third concentration profile of indium, said third concentration profile of indium including a plurality of third characteristic peaks each of that has a peak top;
wherein a ratio of a first minimum horizontal distance, which is measured between said peak tops of said first characteristic peaks and said peak tops of said third characteristic peaks, to a second minimum horizontal distance, which is measured between said peak top of said second characteristic peak and said peak tops of said third characteristic peaks, is less than one seventh;
wherein said epitaxial structure further comprises a second intermediate layer that is disposed between said current spreading layer and said heavily doped layer, and that has a thickness less than said second minimum horizontal distance; and
wherein said second intermediate layer has a thickness less than said second minimum horizontal distance and not less than 80% of said second minimum horizontal distance.

2. The epitaxial structure as claimed in claim 1, wherein said first minimum horizontal distance is less than 20 nm.

3. The epitaxial structure as claimed in claim 1, wherein said second minimum horizontal distance is greater than 150 nm.

4. The epitaxial structure as claimed in claim 1, further comprising a first intermediate layer that is disposed between said current spreading layer and said active layer, and that has a thickness less than said first minimum horizontal distance.

5. The epitaxial structure as claimed in claim 4, wherein the thickness of said first intermediate layer is not less than 80% of said first minimum horizontal distance.

6. The epitaxial structure as claimed in claim 4, wherein said first intermediate layer includes a silicon-doped gallium nitride (GaN) that has a silicon doping concentration ranging between $1.5 \times 10^{17}$ $cm^{-3}$ and $5 \times 10^{17}$ $cm^{-3}$.

7. The epitaxial structure as claimed in claim 1, wherein said second intermediate layer includes a silicon-doped gallium nitride (GaN) that has a silicon doping concentration ranging between $1 \times 10^{18}$ $cm^{-3}$ and $2 \times 10^{18}$ $cm^{-3}$.

8. The epitaxial structure as claimed in claim 1, wherein said heavily doped layer has a silicon doping concentration ranging between $1 \times 10^{18}$ $cm^{-3}$ and $6 \times 10^{18}$ $cm^{-3}$.

9. The epitaxial structure as claimed in claim 1, wherein said current spreading layer includes a periodic superlattice structure that is formed from GaN layers, and $In_xGa_{1-x}N$ layers which alternate with said GaN layers, and wherein $0 \leq x \leq 0.4$.

10. The epitaxial structure as claimed in claim 9, wherein the number of periodic cycles of said periodic superlattice structure of said current spreading layer ranges from 3 to 30.

11. The epitaxial structure as claimed in claim 9, wherein said current spreading layer has a thickness greater than 30 nm and less than 80 nm.

12. The epitaxial structure as claimed in claim 10, wherein, in each of said periodic cycles, said GaN layer has a thickness ranging from 8 nm to 10 nm, and said $In_xGa_{1-x}N$ layer has a thickness ranging from 1 nm to 2 nm.

13. The epitaxial structure as claimed in claim 9, wherein said active layer includes a periodic superlattice structure that is formed from $In_yGa_{1-y}N$ potential well layers, and GaN potential barrier layers which alternate with said $In_yGa_{1-y}N$ potential well layers, and wherein each periodic cycle of said periodic superlattice structure of said active layer has an indium doping concentration that is greater than that of each periodic cycle of said periodic superlattice structure of said current spreading layer.

14. A light-emitting diode comprising the epitaxial structure as claimed in claim 1.

15. An epitaxial structure, comprising:
an n-type layer;
a p-type layer;
an active layer that is disposed between said n-type layer and said p-type layer, and that has a first concentration profile of indium, said first concentration profile of indium including a plurality of first characteristic peaks each of which has a peak top;
a heavily doped layer that is disposed between said n-type layer and said active layer, and that has a second concentration profile of silicon, said second concentration profile of silicon including a second characteristic peak that has a peak top;
a current spreading layer that is disposed between said heavily doped layer and said active layer, and that has a third concentration profile of indium, said third concentration profile of indium including a plurality of third characteristic peaks each of which has a peak top; and
a second intermediate layer that is disposed between said current spreading layer and said heavily doped layer;
wherein a ratio of a first minimum horizontal distance, which is measured between said peak tops of said first characteristic peaks and said peak tops of said third characteristic peaks, to a second minimum horizontal distance, which is measured between said peak top of said second characteristic peak and said peak tops of said third characteristic peaks, is less than one seventh;
wherein said second intermediate layer has a thickness less than said second minimum horizontal distance; and
wherein said second minimum horizontal distance is a sum of a first distance, a second distance, and a third distance, said first distance being a horizontal distance between said peak top and a peak bottom of one of said third characteristic peaks that is nearest to said second characteristic peak, said peak bottom of said one of said third characteristic peaks being located between said peak top of said one of said third characteristic peaks and said peak top of said second characteristic peak, said second distance being a thickness of said second intermediate layer, said third distance being a horizontal distance between said peak top and a peak bottom of said second characteristic peak, said peak bottom of said second characteristic peak being located between said peak top of said second characteristic peak and said one of said third characteristic peaks nearest to said second characteristic peak, said second distance being less than said second minimum horizontal distance and being not less than 80% of said second minimum horizontal distance.

16. The epitaxial structure as claimed in claim 15, wherein said second intermediate layer includes a silicon-doped gallium nitride (GaN) that has a silicon doping concentration ranging between $1\times10^{18}$ cm$^{-3}$ and $2\times10^{18}$ cm$^{-3}$.

\* \* \* \* \*